(12) United States Patent
Kamidi et al.

(10) Patent No.: US 7,576,832 B2
(45) Date of Patent: Aug. 18, 2009

(54) LITHOGRAPHIC APPARATUS AND DEVICE MANUFACTURING METHOD

(75) Inventors: Ramidin Izair Kamidi, Eindhoven (NL); Yin Tim Tso, Eindhoven (NL); Rob Tousain, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 286 days.

(21) Appl. No.: 11/417,212

(22) Filed: May 4, 2006

(65) Prior Publication Data

US 2007/0258079 A1    Nov. 8, 2007

(51) Int. Cl.
 *G03B 27/42* (2006.01)

(52) U.S. Cl. .............................. 355/53; 355/72; 355/75; 700/45; 700/121

(58) Field of Classification Search ................. 355/53, 355/72, 75; 318/649; 700/45, 121
See application file for complete search history.

(56) References Cited

U.S. PATENT DOCUMENTS

| | | | | |
|---|---|---|---|---|
| 6,025,688 | A * | 2/2000 | Sekiguchi | 318/610 |
| 2004/0021840 | A1 * | 2/2004 | Heintze | 355/30 |
| 2004/0176861 | A1 * | 9/2004 | Butler | 700/63 |
| 2005/0267609 | A1 * | 12/2005 | Van Donkelaar et al. | 700/45 |
| 2006/0077364 | A1 * | 4/2006 | Cox et al. | 355/53 |
| 2006/0119829 | A1 * | 6/2006 | Cox et al. | 355/72 |

OTHER PUBLICATIONS

2005 IEEE Conference on Control Applications, Aug. 28-31, 2005, Toronto, Canada, TC 1.6, Metthijs Boerlage, Maarteen Steinbuch, Georgo Angelis: "Frequency response based multivariable control design for motion systems".*
Control Engineering Practice 13, Feb. 2005, p. 145-157, Paul Lambrechts, Matthijs Boerlage, Maarteen Steinbuch: "Trajectory and feed forward design for electrochemical motion systems".*
2004 American Control Conference, Jun. 30-Jul. 2, 2004, Boston Massachusetts, FrM09.4, Matthijs Boerlage, Rob Tousain, Maarten Steinbuch: "Jerk derivative feed forward control for motion systems".*
Control engineering Practice 10, 2002, p. 739-755, Marc van de Wal, Gregor van Baars, Frank Sperling, Okko Bosgra: "Multivariable H_inf/mu feedback control design for high-precision wafer stage motion".*

* cited by examiner

*Primary Examiner*—Diane I Lee
*Assistant Examiner*—Steven H Whitesell-Gordon
(74) *Attorney, Agent, or Firm*—Pillsbury Winthrop Shaw Pittman LLP

(57) ABSTRACT

A lithographic apparatus includes a movable object and a control system to control the position of the movable object. The control system includes a position measurement system configured to measure the position of the movable object, a comparative unit configured to generate a servo error signal by subtracting a position signal representative of an actual position of the movable object from a reference signal, a control unit configured to generate a first control signal based on the servo error signal, a feed-forward unit configured to generate a feed-forward signal based on the reference signal, an addition unit configured to generate a second control signal by adding the first control signal and the feed-forward signal, and an actuator unit configured to actuate the movable object. A gain of the feed-forward unit is dependent on the position of the movable object.

18 Claims, 4 Drawing Sheets

LITHOGRAPHIC APPARATUS AND DEVICE MANUFACTURING METHOD

BACKGROUND

1. Field of the Invention

The present invention relates to a lithographic apparatus and a method for manufacturing a device.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Important factors for the performance of a lithographic apparatus are the throughput, i.e. the number of wafers that is produced within a certain period, and the overlay, i.e. the production quality. In the industry, there is a continuous demand to improve the throughput and overlay of the lithographic apparatus.

In the known lithographic apparatus, the stage accuracy, which is measured in 6 degrees of freedom and is important for overlay, is controlled by using a combination of single input single output (SISO) feedback and feed-forward control for each 6 axes in a two degree of freedom controller structure. The feedback controller guards (robust) stability and increases disturbance rejection, while the feed-forward controller improves tracking performance.

Generally, the higher throughput can impact the overlay performance; higher accelerations (and jerk) cause higher internal dynamic vibrations (or deformations) of the stages, which result in a deterioration of the stage accuracy. The position accuracy of the stages, especially directly after accelerating, is mainly dependent on the accuracy of the set-point feed-forward.

As a reaction of the feedback controller, internal stage deformations, caused by higher accelerations and jerks, result in an overshoot, which deteriorates the settle behaviour of the controller error. In addition to this, the magnitude of the internal stage deformation and with this the overshoot does not have to be the same for every position of the stage.

SUMMARY

It is desirable to provide a lithographic apparatus wherein the throughput and/or the overlay may be improved. In particular, it is desirable to provide a lithographic apparatus in which the motion times of moveable objects is decreased, and in which small settling times for the movable objects are required, so that the throughput may be improved without sacrificing the overlay performance.

According to an embodiment of the invention, there is provided a lithographic apparatus including a movable object and a control system to control a position of the movable object, the control system including: position measurement system configured to measure the position of the movable object, a comparative unit configured to generate a servo error signal by subtracting a position signal representative for an actual position of the movable object from a reference signal, a control unit configured to generate a first control signal on the basis of the servo error signal, a feed-forward unit configured to generate a feed-forward signal on the basis of the reference signal, an addition unit configured to generate a second control signal by adding the first control signal and the feed-forward signal, and an actuator unit configured to actuate the movable object on the basis of the second control signal, wherein one or more coefficients of the feed-forward unit are dependent on the position signal and/or the reference signal.

According to an embodiment of the invention, there is provided a device manufacturing method using a projection system for projecting a patterned beam of radiation onto a substrate, and including the controlling of the position of a movable object, wherein the controlling includes the feed-forward of a reference signal using a feed-forward unit, wherein one or more coefficients of the feed-forward unit depend on the reference signal or a measured position signal of the movable object to compensate for deformation of the movable object.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
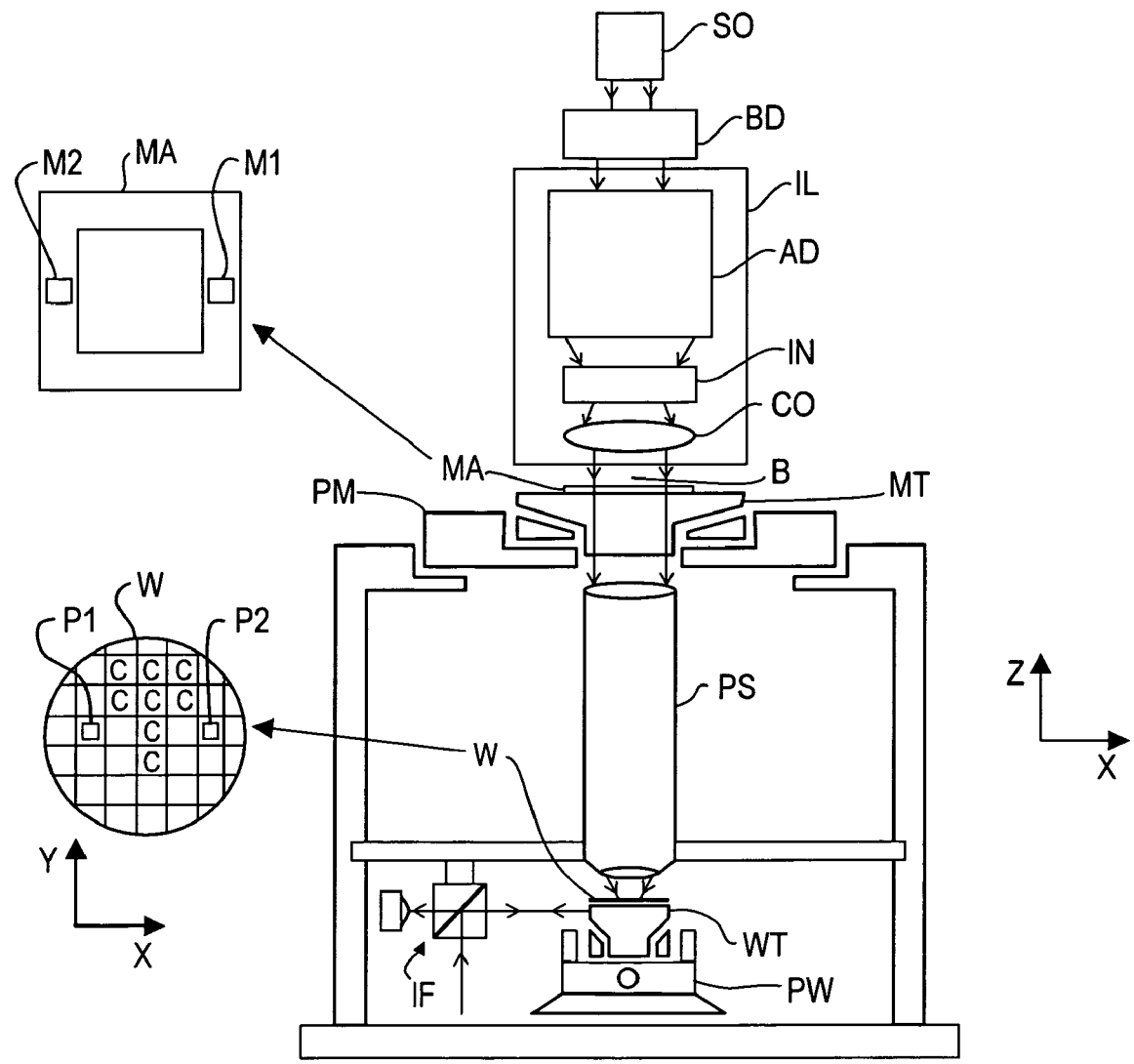
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The substrate stage is a relative stiff body which has to be moved quickly and with great accuracy to obtain the throughput and overlay desired in modern lithography application. However, as demands on throughput and overlay performance are increasing, the stage has to be moved with increasing acceleration without losing overlay performance in order to decrease motion times. Due to the high accelerations, the stage may deform during the acceleration. These internal stage deformations may result in an overshoot which deteriorates the settle behaviour of the substrate stage. This effect of the internal deformations will hereinafter further be explained with reference to FIG. 2.

Figure 2:
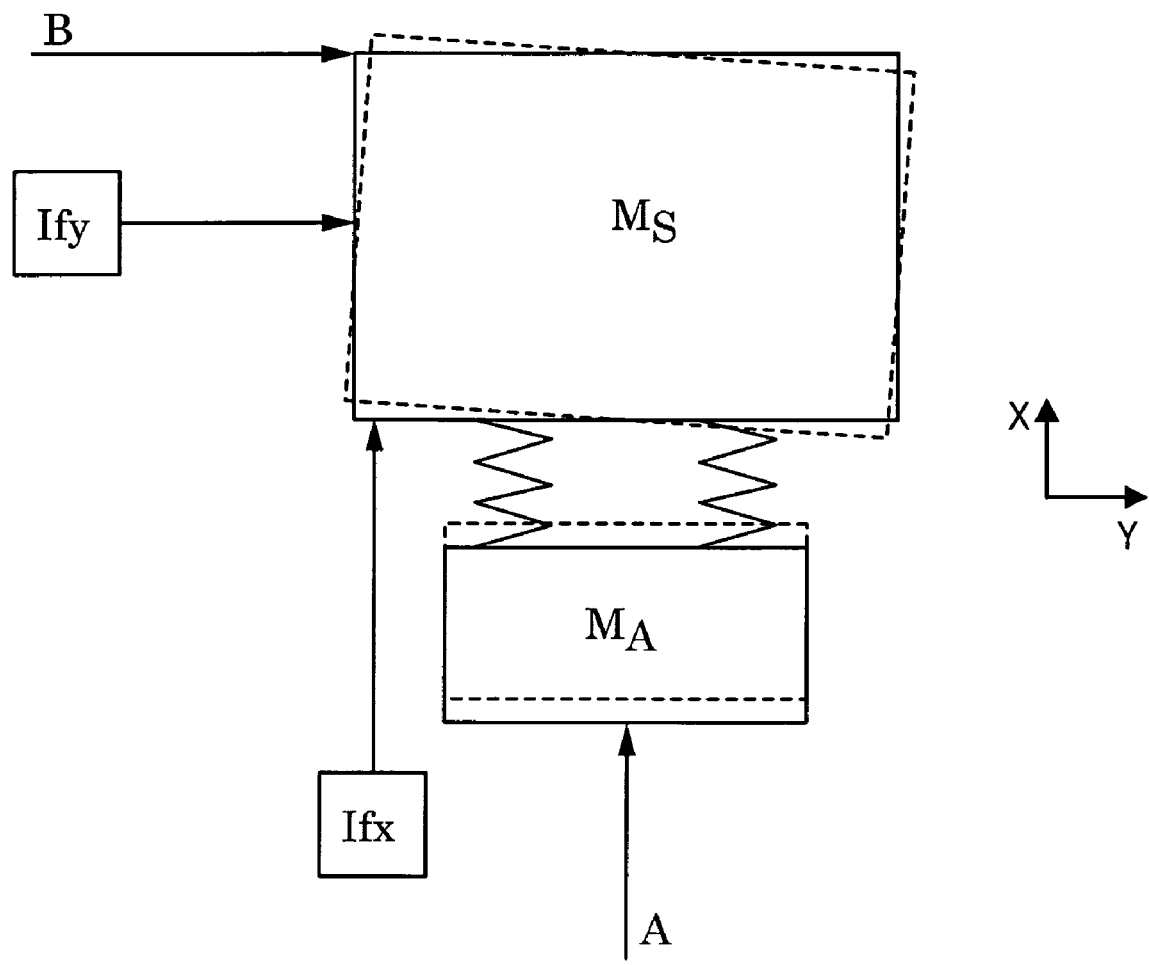
FIG. 2 depicts schematically a top view of a substrate stage in accordance with an embodiment of the invention.

FIG. 2 depicts a schematic top view of a substrate stage represented as a mass-spring system. The mass Ma represents a part of the substrate stage on which the actuator is mounted and the mass Ms represents the rest of the stage. Two springs connect the two masses of the stage. An interferometer Ifx is capable of measuring the x-position of the substrate stage, in particular the mass Ms, and an interferometer Ify is capable of measuring the y-position of the substrate stage, in particular the mass Ms.

In practice, the substrate stage will not behave as a mass spring system having two masses connected by springs, but the mechanics are much more complex. However, as the point where the substrate stage is actuated and the point where the position of the substrate stage is measured are located on different masses Ma and Ms, respectively, the schematic representation as a mass-spring system suffices to explain the effect of internal deformations on the settling behaviour.

When it is desired to move the stage in the direction of arrow A (x-direction), for instance for a scanning movement, the reference signal will be adapted accordingly in order to accelerate the substrate stage in the x-direction. As the actuator mass Ma is directly coupled to the actuator, this mass Ma will directly follow the (change in the) reference signal. This movement is for example indicated by the dashed line in FIG. 2.

However, the mass Ms which is connected via the springs to the mass Ma, will not directly follow the change in the reference signal, but will have some lag due to the presence of the springs. Also, the mass Ms may rotate with respect to the mass Ma due to the presence of the springs. The lag and the rotation of the mass Ms are representative for the internal deformations within the stage.

The controller will notice the lag and rotation as the interferometer Ifx measures the x-position of the mass Ms rather than the position of the mass Ma. Thus, since the controller notices the lag, it will actuate mass Ma in order to compensate for the lag/rotation of mass Ms of which the x-position is measured. As this (over)compensation is not necessary, since the mass Ma already correctly follows the reference signal and the error signal is caused by the (temporary and elastic) internal deformation in thee substrate stage, this (over)compensation will result in an overshoot and as a consequence in a longer settling time. Thus, as a consequence of the internal deformations in the substrate stage, the controller may have a deteriorating effect on the settling time of the substrate stage.

Furthermore, it can be seen in FIG. 2 that the actual x-position of Ms measured by the interferometer Ifx depends on the position of the substrate stage in the y-direction. At the level on which the interferometer Ifx measures in FIG. 2 the actual x-position of the substrate stage (dashed line), the difference between the x-position of the mass Ma and the mass Ms is relatively large. This difference would be smaller when the interferometer Ifx would measure the x-position of the mass Ms at the level indicated with an arrow B. The latter would for instance be the case if the stage would be moved over a certain distance in the y-direction (to the top side of the drawing) before starting the movement indicated by the arrow A.

In general the position of the interferometer is stationary. Thus, upon movement of the substrate stage the position of the substrate stage is measured at different locations on this substrate stage. At these locations different internal deformations may occur. As the amount of internal deformation at a certain location in the substrate stage has an influence on the actual position measured at that location, the position of the substrate stage, in particular the position of the substrate stage with respect to the location of the respective interferometer Ifx, is relevant for compensating the error which is measured due to the internal deformation.

The position of the mass Ms in the y-position is measured by Ify. Due to the acceleration of Ma as a result of a change in the reference signal in the x-direction, the mass Ms rotates. Although the rotation is temporarily and the intended movement of the substrate stage is only in the x-direction, the interferometer Ify measures a change in the actual y-position of the mass Ms. The controller will send a control signal to the actuator to compensate for this change in the y-position. However, as the system itself also compensates for the elastic deformation, the controller signal result in an overshoot and longer settling time in the y-direction.

Furthermore, due to the rotation of the mass Ms, also the measurement of the actual position of the substrate stage in the y-direction is dependent on the position of the substrate stage with respect to the interferometer Ify. The interferometer Ify measures the dashed line of the mass Ma as the actual y-position of the substrate stage. At this location a large change of the actual y-position of the mass Ms is measured. However, when the interferometer would be located (in the drawing) more to the right side, or the substrate stage would be positioned more to the left, the error, determined in the y-direction would be less as the effect of the rotation/deformation is smaller at that location.

Thus, also in another direction (degree of freedom) as the direction in which a movement is made, the actual position measured by the respective interferometer in that other direction may be influenced due to internal deformations of the substrate stage, whereby this influence may be position dependent.

Figure 3:
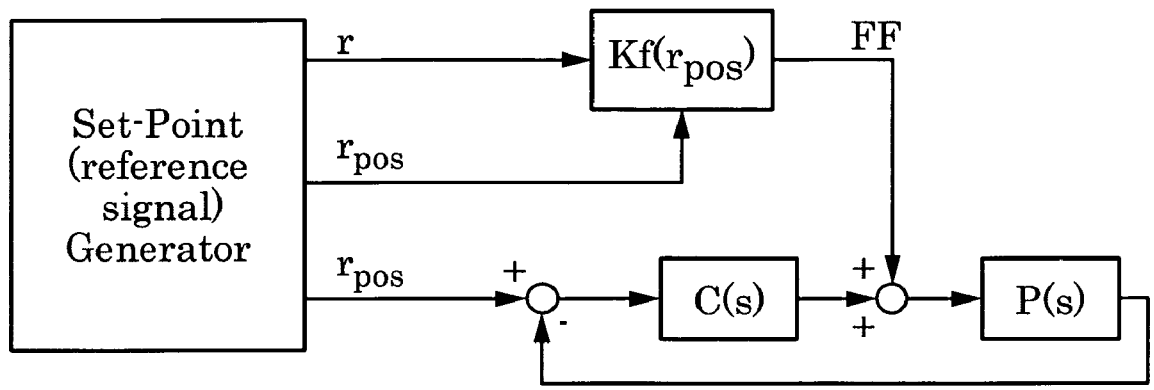
FIG. 3 depicts a control system for a substrate stage according to an embodiment of the invention.
Figure 4:
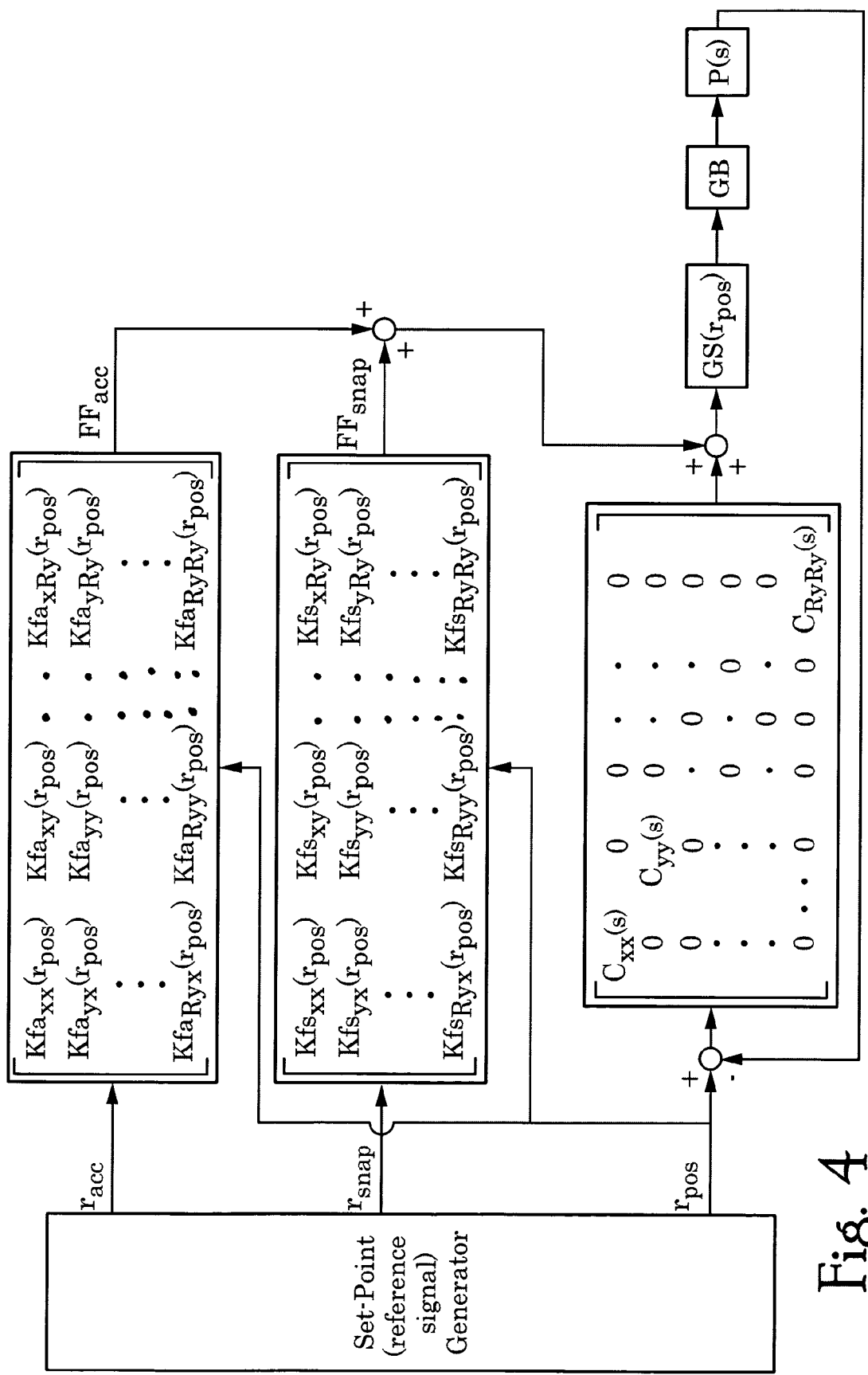
FIG. 4 depicts an embodiment of a MIMO substrate stage control system according to an embodiment of the invention.

In an embodiment of the present invention, there is provided a position control system to deal with one or more of the above situations due to internal deformations of the substrate stage during (large) accelerations, and therewith to avoid overshoot and increasing settling times. Two embodiments of such position control system are shown in FIGS. 3 and 4. These embodiment will be described hereinafter.

In FIG. 3, a position control system according to an embodiment of the invention is shown. At the left side of the drawing a set-point or reference signal generator is shown. This set-point generator provides several reference signals to the control system which are representative of the desired position of the substrate stage, or derivatives thereof. The controller unit is represented by C(s) and the mechanics of the substrate stage is represented by P(s).

A servo error signal is fed to the controller unit C(s). This servo error signal is the difference between the position reference signal rpos and the actual position of the substrate stage measured by the position measurement system, for instance an interferometer system. This servo error signal is generated by a comparative unit. The position measurement system measures the position of the substrate stage in six degrees of freedom DOF. The control system is a combination of six SISO control systems, one for each degree of freedom.

A reference signal is fed to the feed-forward unit Kf(rpos). This reference signal may be any signal which is useful to represent the acceleration and/or deformation of the substrate stage. In a preferred embodiment the second and fourth derivative of the reference position signal are used, i.e. the acceleration and snap. However, any other suitable signal such as velocity, jerk and crack (first, third and fifth derivative of the reference position signal) may also be used. The feed-forward signal output by the feedforward is added to the output of the controller unit with an addition unit. The output of the addition unit is fed to the mechanics of the substrate stage represented by P(s)

The gains or more generally the coefficients of the feed-forward unit are made dependent on the position of the substrate stage. This position of the substrate stage is, as shown in FIG. 3, brought into the feed-forward unit by feeding the reference position signal to the feed-forward unit. As a result of the relative large scale on which the effects of the position dependence of the substrate stage occur, the possible difference between reference position signal and actual position signal does not have a large influence on the effect of the position dependent feed-forward. In alternative embodiments one or more gains or coefficients of the feed-forward unit may be determined based on derivatives of the position reference signal, such as speed, acceleration, jerk, snap, crack and such, and/or other signals being dependent on the position set-point, possibly in combination with the position reference signal. Also, one or more gains or coefficients of the feed-forward unit may be determined on the actual position of the movable object, a derivative thereof, and/or another signals being dependent on the actual position of the movable object.

In yet another embodiment one or more gains are dependent on the difference between the reference signal and the position signal. In an embodiment, all gains of the feed-forward unit are dependent on the position signal and/or said reference signal.

Furthermore, instead of or in addition to the gains, other coefficients of the feed-forward unit, such as time constants, may depend on the reference signal and/or the position signal.

By feed-forward of the reference signal which also takes into account the internal deformation of the substrate stage and the location thereof by multiplying the reference signal with a certain gain or other coefficients of the feed-forward unit which are position dependent, the control system takes the effect of the deformation on the measurement into account, and compensates therefor. As a result, mass Ms instead of mass Ma will follow the reference signal while mass Ma will actually be ahead of the reference signal. The actual position measured by the respective measurement system will thus match with the reference signal. Therefore, the controller will not compensate and the overshoot and increasing settling times resulting from the compensation will not occur.

The control system of FIG. 3 provides a solution for the effects of internal deformations in a single degree of freedom. However, as explained in relation to FIG. 2, the internal deformations caused by acceleration/movement in one degree of freedom may also result in worse behaviour in other degrees of freedom. The position control system of FIG. 4 may also provide a solution for this effect.

In FIG. 4, a more advanced position control system in accordance with an embodiment is shown. In this system, the SISO independent position control system is replaced by a multi-input multi-output MIMO position dependent set-point feed-forward in order to compensate for controller errors in the non-scanning (non-movement) axes (degrees of freedom) and for position dependent dynamics and cross-talk in all axes, caused by internal deformations of the substrate stage.

In this system the 6 DOF position, acceleration and snap set-points are defined as:

$$r_{pos} = \begin{bmatrix} x_{setp\_pos} \\ y_{setp\_pos} \\ Rz_{setp\_pos} \\ z_{setp\_pos} \\ Rx_{setp\_pos} \\ Ry_{setp\_pos} \end{bmatrix}, r_{snap} = \begin{bmatrix} x_{setp\_snap} \\ y_{setp\_snap} \\ Rz_{setp\_snap} \\ z_{setp\_snap} \\ Rx_{setp\_snap} \\ Ry_{setp\_snap} \end{bmatrix}, r_{acc} = \begin{bmatrix} x_{setp\_acc} \\ y_{setp\_acc} \\ Rz_{setp\_acc} \\ z_{setp\_acc} \\ Rx_{setp\_acc} \\ Ry_{setp\_acc} \end{bmatrix}$$

The MIMO plant P(s) (in this case the substrate stage) has 6 inputs (Fx, Fy1, Fy2, Fz1, Fz2, Fz3) and 6 outputs (xpos, ypos, Rzpos, zpos, Rxpos, Rypos):

$$P(s) = \begin{bmatrix} P_{xx}(s) & P_{xy}(s) & \cdots & & & P_{xRy}(s) \\ P_{yx}(s) & P_{yy}(s) & \cdots & \cdots & \cdots & P_{yRy}(s) \\ \vdots & & \ddots & & & \\ \vdots & & & \ddots & & \\ \vdots & & & & \ddots & \\ P_{Ryx}(s) & P_{Ryy}(s) & & & & P_{RyRy}(s) \end{bmatrix}$$

The Gain Balancing (GB) and the Gain Scheduling (GS(rpos)) are used to de-couple the 6 DOF MIMO plant P(s) in order to reduce cross talk. The de-coupled mechanics may be approximated by 6 SISO systems x/y/Rz/z/Rx/Ry, which are controlled by 6 SISO controllers Cxx(s), Cyy(s), ..., Cry Ry(s), respectively.

The difference between MIMO and SISO set-point feed-forward is that when an axis has to follow a position set-point, in the MIMO system feed-forward forces may be applied on all 6 axes, which are generated using the set-points of the corresponding axis, instead of in the SISO system only one feed-forward force in the same axis.

If for instance a combined movement in x and y is performed, feed-forward forces from x and y to the x/y/Rz/z/Rx/Ry axes may be applied. As a consequence, in each degree of freedom two different feed-forward forces may be applied, one based on the movement in the x-direction and the other based on the movement in the y-direction.

In an embodiment delay corrections for all 6 axes may be used for the acceleration and snap feed-forward, possibly separately, in order to compensate for IO delay and zero order hold. Delay corrections may be performed using time delay units. In an embodiment, the feedforward unit comprises one or more time delay corrections. It is remarked that these delay corrections are not explicitly shown in the embodiment of FIG. 4.

The following functions may be used for the position dependent acceleration and snap feed-forward, respectively:

$$Kfa(r_{pos}) = \sum_{i=1}^{N} w_i(r_{pos}) \cdot Kfa_i$$

and $$Kfs(r_{pos}) = \sum_{i=1}^{N} w_i(r_{pos}) \cdot Kfs_i$$

The acceleration parameters Kfai and snap parameters Kfsi determined at certain positions are constant values while the scheduling functions wi are dependent on the position rpos and may have the following characteristics:

$$\sum_{i=1}^{N} w_i(r_{pos}) = 1, \ 0 \le w_i(r_{pos}) \le 1 \ \forall \ r_{pos}$$

These scheduling functions can be chosen in such a way that Kfa(rpos)/Kfs(rpos) is equal to the real position dependent snap (for all positions) or as linear functions where the real position dependent snap is approximated. If linear scheduling functions are chosen then the extent in which the position dependency is approximated is dependent on the number of acceleration parameters Kfai and/or snap parameters Kfsi (determined at certain positions) used for the feed-forward.

After the system is de-coupled (GB is optimized), small settling time and thus a substantial throughput improvement of the stages, is attained in all axes and all positions using the MIMO position dependent set-point feed-forward with linear scheduling functions. The controllers errors directly after acceleration are considerably reduced which result in an overlay improvement.

Thus, with the position control system shown in FIG. 4, the effect of internal deformations in another degree of freedom than the degree of freedom wherein a movement/acceleration is made can be compensated by using the MIMO feed-forward. For instance, the possible incorrect measurement in the y-direction as described in relation to FIG. 2 for Ify is compensated by the control system. Upon movement of the substrate stage in the x-direction, the mass Ma will be moved by the actuator in the y-direction so that the mass Ms, although moved by the internal deformations with respect to Ma, substantially remains in the y-position that matches with the reference signal in the y-direction, during the accelerations/movement in the x-direction. As a result, there will be no error signal in the y-direction and the controller will not have to provide a control signal to compensate. Therefore, overshoot and larger settling times are substantially avoided.

It will be appreciated that the position control system, in particular the feed-forward unit will also compensate for all other degrees of freedom, including the degree of freedom in which the movement is made. Thus, overshoot and larger settling times are substantially avoided in all degrees of freedom due to the position control system of the present invention. Therewith, the throughput and overlay performance may substantially be improved.

The control system of FIG. 4 takes in the feed-forward unit the position of the substrate stage into account by making the gains of the feed-forward unit dependent on the position of the substrate stage. However, for instance in a system wherein this position dependence does not play a major role (substantially the same deformations along the reflective surface of a substrate stage in an interferometer system) or is not present (sensor on fixed location on substrate stage), the position dependence of the gains of the feed-forward unit may be omitted. In such system the MIMO feed-forward unit may still be beneficial to compensate for the internal deformations of the substrate stage.

Hereinabove, position control systems have been described for the control of the position of a substrate stage. Similar systems may be used to control the position of another movable object of a lithographic apparatus with high accuracy. In particular, the control system may be used to control the position of a reticle stage.

The position control system may be realized as software in a computer program, or as a hardware control system, or a combination thereof, or any other type of suitable control system.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising a movable object and a control system configured to control a position of said movable object, said control system comprising:
   a position measurement system configured to measure the position of said movable object;
   a comparative unit configured to generate a servo error signal by subtracting a position signal representative of an actual position of said movable object from a reference signal;
   a control unit configured to generate a first control signal based on said servo error signal;
   a feed-forward unit configured to generate a feed-forward signal based on said reference signal;
   an addition unit configured to generate a second control signal by adding said first control signal and said feed-forward signal; and
   an actuator unit configured to actuate said movable object based on said second control signal,
   wherein one or more coefficients of a function representative of said feed-forward unit are dependent on said position signal and/or said reference signal.

2. The lithographic apparatus of claim 1, wherein said feed-forward unit is a multi-input multi-output (MIMO) feed-forward unit.

3. The lithographic apparatus of claim 1, wherein said one or more coefficients comprise one or more gains of said feed-forward unit.

4. The lithographic apparatus of claim 1, wherein said one or more coefficients comprise one or more time constants of said feed-forward unit.

5. The lithographic apparatus of claim 1, wherein the feed-forward unit comprises one or more time delay units.

6. The lithographic apparatus of claim 1, wherein said feed-forward unit is configured to generate a feed-forward signal in a first degree of freedom based on a change in the reference signal in another degree of freedom, wherein said feed-forward signal compensates for deformation of said movable object in said first degree of freedom as a result of movement of said movable object in said other degree of freedom.

7. The lithographic apparatus of claim 1, wherein all gains of said feed-forward unit are dependent on the position signal and/or said reference signal.

8. The lithographic apparatus of claim 1, wherein said one or more coefficients are determined based on at least one of a position set-point, a derivative of said position set-point, or another signal being dependent on said position set-point.

9. The lithographic apparatus of claim 1, wherein said feed-forward unit generates a feed-forward signal using the second and the fourth derivative of the reference signal.

10. The lithographic apparatus of claim 1, wherein said feed-forward unit is configured to generate a feed-forward signal in a first degree of freedom based on a change in the reference signal in said first degree of freedom, wherein said feed-forward signal compensates for deformation of said movable object in said first degree of freedom as a result of movement of said movable object in said first degree of freedom.

11. The lithographic apparatus of claim 1, wherein said position measurement system is configured to measure the position of said movable object in six degrees of freedom.

12. The lithographic apparatus of claim 1, wherein said position measurement system is an interferometer position measurement system.

13. The lithographic apparatus of claim 1, wherein said movable object is a substrate stage or a reticle stage.

14. The lithographic apparatus of claim 2, wherein said control system comprises a gain balancing unit and/or a gain scheduling unit configured to de-couple the dynamics of said movable object in the degrees of freedom in which said movable object is controlled.

15. A lithographic apparatus comprising a movable object and a control system configured to control a position of said movable object, said control system comprising:
   a position measurement system configured to measure the position of said movable object;
   a comparative unit configured to generate a servo error signal by subtracting a position signal representative of an actual position of said movable object from a reference signal;
   a control unit configured to generate a first control signal based on said servo error signal;
   a feed-forward unit configured to generate a feed-forward signal based on said reference signal;
   an addition unit configured to generate a second control signal by adding said first control signal and said feed-forward signal; and
   an actuator unit configured to actuate said movable object based on said second control signal,
   wherein one or more coefficients of said feed-forward unit are dependent on said position signal and/or said reference signal, and
   wherein said one or more coefficients are determined based on at least one of the actual position of said movable object, a derivative of said actual position, or another signal being dependent on said actual position.

16. A device manufacturing method comprising:
   projecting a patterned beam of radiation onto a substrate, and
   controlling a position of a movable object, said controlling comprising feed-forwarding a reference signal using a feed-forward unit, wherein one or more coefficients of a function representative of the feed-forward unit depend on said reference signal or a measured position signal of said movable object to compensate for deformation of said movable object.

17. The method of claim 16, wherein said feed-forward unit is a multi-input multi-output (MIMO) feed-forward unit, that generates a feed-forward signal in a first degree of freedom based on a change in the reference signal in an other degree of freedom, wherein said feed-forward signal compensates for deformation of said movable object in said first degree of freedom as a result of movement of said movable object in said other degree of freedom.

18. The method of claim 16, wherein said moveable object is a substrate table configured to hold the substrate or a pattern support configured to hold a patterning device used to form the patterned beam of radiation.

* * * * *